United States Patent

Fukuchi

[11] Patent Number: 6,163,210
[45] Date of Patent: Dec. 19, 2000

[54] FEED-FORWARD AMPLIFIER WITH IMPROVED LINEARITY UPON INITIAL ACTIVATION

[75] Inventor: Akio Fukuchi, Tokyo, Japan

[73] Assignee: NEC Corporation, Tokyo, Japan

[21] Appl. No.: 09/330,922

[22] Filed: Jun. 11, 1999

[30] Foreign Application Priority Data

Jun. 17, 1998 [JP] Japan .................................. 10-170327

[51] Int. Cl.[7] ...................................................... H03F 3/66
[52] U.S. Cl. ............................................. 330/52; 330/151
[58] Field of Search ............................ 330/52, 149, 151, 330/289

[56] References Cited

U.S. PATENT DOCUMENTS

| | | | |
|---|---|---|---|
| 4,394,624 | 7/1983 | Bauman | 330/151 |
| 5,386,198 | 1/1995 | Ripstrand et al. | 330/52 |
| 5,977,826 | 11/1999 | Behan et al. | 330/52 X |

FOREIGN PATENT DOCUMENTS

| | | |
|---|---|---|
| 0678976 | 10/1995 | European Pat. Off. . |
| 0720284 | 7/1996 | European Pat. Off. . |
| 62-501603 | 6/1987 | Japan . |
| 1-198809 | 8/1989 | Japan . |
| 5-235671 | 9/1993 | Japan . |
| 2107540 | 4/1983 | United Kingdom . |
| 2273622 | 6/1994 | United Kingdom . |

OTHER PUBLICATIONS

"Digital Radio Communications," Masayoshi Muroya and Heiichi Yamamoto and published by Sangyo Tosho, p. 168, publication date unknown. (See specification p. 1.).

European Search Report (in English) issued Oct. 21, 1999 in a related application.

*Primary Examiner*—Steven J. Mottola
*Attorney, Agent, or Firm*—Ostrolenk, Faber, Gerb & Soffen, LLP

[57] ABSTRACT

A feed-forward amplifier is provided, which can implement satisfactory linearity immediately after its activation. The amplifier has a high productivity and exhibits less long term fluctuations of its characteristics during the operation. In the feed-forward amplifier, the transfer function of a path from an input terminal to a directional coupler via a main amplifier and the transfer function of a path from the input terminal to the directional coupler via a first delay means are automatically controlled so as to be equal in amplitude but anti-phase relative to each other. The transfer function of a path from the main amplifier to an output terminal via a second delay means and the transfer function of a path from the main amplifier to the output terminal via an auxiliary amplifier are automatically controlled so as to be equal in amplitude but anti-phase relative to each other. Still further, at the time of the activation of the feed-forward amplifier, control values of a first vector adjuster are set to values stored in a first nonvolatile memory in accordance with a temperature measured in the vicinity of the main amplifier by a first temperature sensor. Control values of a second vector adjuster are set to values stored in a second nonvolatile memory in accordance with a temperature measured in the vicinity of the auxiliary amplifier by a second temperature sensor.

9 Claims, 6 Drawing Sheets

FEED-FORWARD AMPLIFIER WITH IMPROVED LINEARITY UPON INITIAL ACTIVATION

BACKGROUND OF THE INVENTION

1. File of the Invention

The present invention relates to a feed-forward amplifier and, more particularly, to a feed-forward amplifier having satisfactory linearity immediately after its activation.

2. Description of the Related Art

To amplify high-frequency carrier signals under low distortions, a feed-forward amplifier or the like is used since a feedback amplifier like that used for a low frequency band is inappropriate. The feed-forward amplifier eliminates distortions by extracting a distortion occurring in the linear amplifier itself and adding a compensation signal to the output of the linear amplifier for cancellation. The compensation signal is obtained by adjusting the gain and phase shift of the distortion signal.

FIG. 2 shows in block form the basic circuit structure of a feed-forward amplifier (see, e.g., p. 168 of "Digital Radio Communications" written by Masayoshi Muroya and Heiichi Yamamoto and published by Sangyo Tosho). As shown in FIG. 2, the feed-forward amplifier comprises a signal divider 31, a main amplifier 32, a delay line 33, an error extraction coupler 34, an auxiliary amplifier 35, a delay line 36 and an error elimination coupler 37.

As shown in FIG. 2, this feed-forward amplifier has two loops, i.e., an error detection loop and an error elimination loop. The error detection loop extracts an error (composed of a distortion component and noise) generated in the main amplifier (the target for distortion-compensation). The error elimination loop cancels the error by amplifying the extracted error, inverting the phase of the amplified error, and by combining the amplified error to the output of the main amplifier.

To implement the above function, the error detection loop is designed so that the transfer function of a path from the input terminal to the auxiliary amplifier 35 via the main amplifier 32 and the transfer function of a path from the input terminal to the auxiliary amplifier 35 via the delay line 33 are equal in amplitude but reverse-phased to each other. Therefore, only a distortion component generated in the main amplifier 32 is extracted and applied to the auxiliary amplifier 35. Similarly, the error elimination loop is designed so that the transfer function of a path from the main amplifier 32 to the output terminal via the delay line 36 and the transfer function of a path from the main amplifier 32 to the output terminal via the auxiliary amplifier 35 are equal in amplitude but reverse-phased to each other. Therefore, the error elimination loop eliminates the distortion and noise generated in the main amplifier 32. Hence, the feed-forward amplifier 32 in FIG. 2 can achieve satisfactory distortion characteristics.

As is apparent from the basic circuit structure shown in FIG. 2, to operate the feed-forward amplifier satisfactorily, the error detection loop and the error elimination loop need to be in equilibrium with high accuracy. However, it is not so easy to maintain the equilibrium. For example, to make a distortion compensation of −30 dB, the deviations of the amplitude and phase need to be within about ±0.1 dB and within about ±1 degree, respectively. However, it is difficult to maintain such conditions in the structure shown in FIG. 2. For example, the gain and phase shift amount of the main amplifier change between a state in which a carrier is applied and a state in which no carrier is applied. This is because the temperature of the amplifier changes due to a change in the heat produced by the amplifier that is brought about by the presence of a carrier. Thus, there have been proposed various automatic control techniques for maintaining the equilibrium of the feed-forward amplifier.

FIG. 3 is a block diagram of first prior art for maintaining the equilibrium of a feed-forward amplifier disclosed in Japanese Patent Application Laid Open No. Tokukohyou Sho 62-501603 (PCT).

As shown in FIG. 3, a first feed-forward amplifier of the prior art roughly comprises a signal divider 41, a coupler 42, a main amplifier 43, a coupler 44, a delay unit 45, a coupler 46, a coupler 47, an attenuator 48, a phase shifter 49, a delay unit 50, an adder 51, an attenuation and phase adjustment section 52, an automatic control circuit 53, an auxiliary amplifier 54 and a narrow-band pilot receiver 55. The narrow-band pilot receiver 55 includes a mixer 551 and an intermediate-frequency amplifier and logarithmic detector 552.

In the feed-forward amplifier shown in FIG. 3, a test signal, i.e., a pilot signal is inserted into an input signal path through the coupler 42. The inserted pilot signal is mixed with an input signal from one of the output terminals of the divider 41, and thereafter applied to the main amplifier 43. The amplitude of the resultant pilot signal is adjusted so as to be equal to the level of a distortion component generated in the main amplifier 43. The level of the distortion component is typically lower than a desired signal level by about 30 dB. The amplitude and delay of the input signal from the other output terminal of the divider 41 is adjusted so as to be equal to the amplitude and delay of the deteriorated output, but its phase is adjusted so as to be exactly reversed to the deteriorated output. The adder 51 cancels the input signal received from the delay unit 50 and the input signal component received from the coupler 44, and hence outputs only a distortion component.

The automatic control circuit 53 uses the pilot signal as a reference signal, which is detected by the narrow-band pilot receiver 55. To this end, the distortion-cancelled output from the coupler 46 is applied to the narrow-band pilot receiver 55 through the coupler 47 and the amplitude of the pilot signal is detected by the automatic control circuit 53. By adjusting the gain and phase of the attenuation and phase adjustment section 52 accurately using this information, both the pilot signal and the distortion generated in the main amplifier 43 can be canceled optimally.

In the above reference No. 62-501603, automatic control of the error detection loop is not described in detail and, generally, when the auxiliary amplifier has adequate output-power-to-distortion characteristics, it is not necessary to optimize the error detection loop at all times.

FIG. 4 is a block diagram for explaining a second prior art device disclosed in Japanese Patent Application Laid Open No. Tokukai Hei 1-198809.

As shown in FIG. 4, the feed-forward amplifier of the second prior art devices comprises a distortion detection loop 61, a power combiner 62, a distortion elimination loop 63, a directional coupler 64, a level detector 65, a synchronous detection circuit 66 and a control circuit 67. The distortion detection loop 61 includes a power divider 611, a main amplifier 612, a variable attenuator 613, a variable phase shifter 614, a pilot oscillator 615 and a directional coupler 616. The distortion elimination loop 63 includes a power combiner 631, a variable attenuator 632, a variable phase shifter 633, an auxiliary amplifier 634 and a directional coupler 635. The synchronous detection circuit 66 includes a mixer 661, a low-pass filter 662 and a dc amplifier 663.

When a signal is inputted, the level detector 65 detects the total output power level or the signal level of a predetermined frequency component, at the output stage of the auxiliary amplifier 634. The control circuit 67 adjusts the variable attenuator 613 and the variable phase shifter 614 so as to a minimize the detected signal level, so that the transfer characteristics of the two signal paths constituting the distortion detection loop 61 become in the equilibrium in which the transfer characteristics are equal in amplitude and reverse-phased to each other.

Next, the control circuit 67 adjusts the variable attenuator 632 and the variable phase shifter 633 so that the output level of the synchronous detection circuit 66 becomes minimum. Since the circuit is constructed so that the conditions for cancelling a pilot signal are the same as the conditions for cancelling a distortion generated in the main amplifier 612, the above control is effective, and the distortion elimination loop achieves the equilibrium in which the transfer characteristics of the two signal paths constituting the distortion elimination loop 63 are equal in amplitude and reverse-phased to each other.

Thus, in the second prior art feed-forward amplifier, the transfer functions of the error detection loop are automatically controlled so as to minimize the output of the auxiliary amplifier by detecting the output level of a carrier signal in the auxiliary amplifier.

FIG. 5 is a block diagram for explaining a third prior art device disclosed in Japanese Patent Application Laid Open No. Tokukai Hei 1-198809.

As shown in FIG. 5, the feed-forward amplifier of the third prior art device comprises a distortion detection loop 71, a power combiner 72, a distortion elimination loop 73, a directional coupler 74, a signal selector 75, a synchronous detection circuit 76, a control circuit 77, a pilot oscillator 78, a signal selector 79 and a directional coupler 80. The distortion detection loop 71 includes a power divider 711, a main amplifier 712, a variable attenuator 713, a variable phase shifter 714 and a directional coupler 715. The distortion elimination loop 73 includes a power combiner 731, a variable attenuator 732, a variable phase shifter 733, an auxiliary amplifier 734 and a directional coupler 735. The synchronous detection circuit 76 includes a mixer 761, a low-pass filter 762 and a dc amplifier 763.

In the third prior art feed-forward amplifier, the directional coupler 80 for injecting a pilot signal is inserted in the input side of the feed-forward amplifier. Further, the signal selector 75 is inserted in the input of the synchronous detection circuit 76, and the signal selector 79 is inserted in the output of the pilot oscillator 78.

When the signal selectors 75 and 79 are connected, respectively, by the solid lines as indicated, the operation of the feed-forward amplifier becomes equivalent to that of the second prior art device and its operation is also similar, and hence the distortion elimination loop 73 can also be automatically adjusted.

On the other hand, when the signal selectors 75 and 79 are connected, respectively, by the broken lines as indicated, the pilot signal injected by the directional coupler 80 is branched by the directional coupler 735, and the level of the branched pilot signal is detected by the synchronous detection circuit 76. The pilot signal detected by the circuit 76 is derived from deviations from the equal amplitude and reversed-phase relationship requirements imposed on the two signal paths of the distortion detection loop 71, and is, originally, of the same nature as a signal component which is to be completely suppressed. Thus, when the variable attenuator 713 and the variable phase shifter 714 are adjusted so that the detected level of this signal is reduced to a minimum, any residual signal component attributable to the disequilibrium of the distortion detection loop 71 can be reduced satisfactorily, and hence the optimal operating condition of the distortion detection loop 71 can be achieved.

Further, the control circuit 77 adjusts the variable attenuator 732 and the variable phase shifter 733 so as to minimize the output level of the synchronous detection circuit 76, so that the transfer characteristics of the two paths constituting the distortion elimination loop 73 achieve the equilibrium in which the transfer characteristics are equal in amplitude and reverse-phased to each other.

Thus, in the third prior art feed-forward amplifier, the transfer functions of the error detection loop are automatically controlled so as to minimize the level of the pilot signal by using the output of the auxiliary amplifier while injecting the pilot signal into the input of the feed-forward amplifier.

FIG. 6 is a block diagram for explaining a fourth prior art device disclosed in Japanese Patent Application Laid Open No. Tokukai Hei 5-235671.

As shown in FIG. 6, the fourth prior art feed-forward amplifier comprises a divider 91, a variable attenuator 92, a variable phase shifter 93, a main amplifier 94, a delay line 95, a divider/combiner 96, a variable attenuator 97, a variable phase shifter 98, an error amplifier 99, a delay line 100, a combiner 101, temperature sensors 102 and 103, analog-to-digital (A/D) converters 104 and 105, a central processing unit (CPU) 106, a nonvolatile memory 107, a memory 108, digital-to-analog (D/A) converters 109, 110, 111 and 112, and an input/output section (I/O) 113.

In FIG. 6, the circuit elements from the divider 91 to the combiner 101 constitute a distortion compensation amplifier. Further, the circuit elements from the divider 91 to the divider/combiner 96 constitute an error detection loop. One of the input signal components divided by the divider 91 is adjusted by the variable attenuator 92 and the variable phase shifter 93 in amplitude and phase, respectively, and the adjusted input signal component is amplified by the main amplifier 94 and applied to the divider/combiner 96. On the other hand, the other input signal component divided by the divider 91 is delayed via the delay line 95 so as to synchronize with the signal from the main amplifier 94, and the delayed input signal component is applied to the divider/combiner 96. The divider/combiner 96 detects from its two input signals an error component a (composed of a distortion component and a noise component) produced by the main amplifier 94, and outputs the detected error component a.

Further, the circuit elements from the divider/combiner 96 to the combiner 101 constitute an error elimination loop. The amplitude and phase of the error component provided by the divider/combiner 96 are adjusted by the variable attenuator 97 and the variable phase shifter 98, respectively, and the adjusted error component is amplified by the error amplifier 99 and applied to the combiner 101. On the other hand, the signal containing an error attributable to the amplification by the main amplifier 94 is provided by the divider/combiner 96, and delayed via the delay line 100 so as to synthesize with the signal from the error amplifier 99 and applied to the combiner 101. The combiner 101 inverts the phase of the error component provided by the error amplifier 99 and combines the inverted error component with the signal from the delay line 100, whereby a signal from which the error component has been cancelled is output.

Further, the circuit elements from the temperature sensor 102 to the I/O 113 constitute a temperature compensation circuit. Since the temperature characteristics of the distortion compensation amplifier are regulated by the main amplifier 94 and the error amplifier 99, the temperatures of the main amplifier 94 and the error amplifier 99 are measured by locating the temperature sensors 102 and 103 in the vicinity of the amplifiers 94 and 99, respectively. The temperature data obtained by the temperature sensors 102 and 103 are converted into digital data by the A/D converters 104 and 105, respectively, and the digital data are applied to the CPU 106. The nonvolatile memory 107, e.g., an EEPROM (Electrically Erasable Programmable Read-Only Memory) has values previously written respectively for the variable attenuator 92, the variable phase shifter 93, the variable attenuator 97 and the variable phase shifter 98 so that the distortion of the distortion compensation amplifier is minimized within a predicted temperature range. During the operation, the CPU 106 moves the data in the nonvolatile memory 107 to the memory 108, writes an assumed intermediate temperature between the read temperatures, reads the values in the memory 108 corresponding to the temperatures detected by the temperature sensors 102 and 103, converts the read values into analog values through the D/A converters 109, 110, 111 and 112, and applies the analog values to the variable attenuator 92, the variable phase shifter 93, the variable attenuator 97 and the variable phase shifter 98, whereby these values are controlled so as to be optimal.

Thus, the fourth prior art feed-forward amplifier aims at maintaining the transfer functions of the error detection loop and the transfer functions of the error elimination loop constant not only by locating the temperature sensors in the vicinity of the amplifiers and controlling the transfer functions of the error detection loop and the transfer functions of the error elimination loop in accordance with the temperatures measured in the vicinity of the amplifiers, respectively, but also by changing the control values while predicting the characteristics of the amplifiers which change due to a temperature change using the temperatures measured in the vicinity of the amplifiers.

However, these conventional feed-forward amplifiers have addressed the problem that their operations are not always satisfactory.

First of all, the first prior art does not describe details about the automatic control of the error detection loop. Generally, it is not necessary for the feed-forward amplifier to optimize the transfer functions of the error detection loop by providing special automatic control means, as long as the auxiliary amplifier has output power with a sufficient margin. However, in order to improve the power utilization efficiency and curtail the production cost, the output powers of the main amplifier and the auxiliary amplifier need to be reduced to a necessary minimum. An order to reduce the output powers of the amplifiers to a necessary minimum, it is preferable to employ automatic control so that the amplifiers can accommodate temperature changes and long term fluctuations. Thus, to implement a more inexpensive and more highly efficient feed-forward amplifier, automatic control is effected for the error detection loop so that the transfer functions of the error detection loop are optimally controlled.

Secondly, the technique disclosed in the second prior art device, in which the distortion detection loop (the error detection loop) is automatically controlled so as to minimize the output of the auxiliary amplifier by detecting the output level of the auxiliary amplifier in order to automatically control the error detection loop, does not allow automatic control to be effected unless a carrier is actually applied. This is because automatic control is effected by utilizing an input signal to be amplified. Thus, this technique addresses a shortcoming that distortion characteristics immediately after the activation are poor. That is, the amplifier characteristics immediately after the application of a carrier are not satisfactory.

Further, since the input signal is generally modulated, control is susceptible to errors unless the time constant of a smoothing circuit in the detector is sufficiently increased compared with the modulated signal or the like. On the other hand, when the time constant of the detector is increased, it becomes difficult to effect high-speed control, and this, in turn, entails a relatively long time to converge the control. Thus, addressed is a shortcoming that the impaired characteristics persist for a long time.

Further, the technique disclosed in the third prior art device, in which the distortion detection loop (the error detection loop) is controlled so as to minimize the pilot signal in the output of the auxiliary amplifier by injecting the pilot signal instead of a carrier in order to automatically control the error detection loop, causes the pilot signal to leak outside in theory, and hence addresses a shortcoming that means for preventing the leakage of the pilot signal needs to be provided separately.

Further, the technique disclosed in the fourth prior art device, in which control is effected in accordance with the temperatures measured in the vicinity of the amplifiers by locating the temperature sensors in the vicinity of the amplifiers, respectively, imposes difficulties in preparing a table of temperatures versus control values. When the temperature characteristics are obtained for each amplifier, a highly accurate table can be prepared. However, measuring of the temperature characteristics for each amplifier as a product enormously increases the production cost, and hence is not preferable. On the other hand, when the temperature characteristics of amplifiers are assumed to be consistent, production-related problems can be avoided. But, when there are fluctuations between amplifiers, the characteristics of the amplifiers deteriorate. Further, in this technique in which the temperature characteristics of each amplifier does not change during the operation, long term fluctuations of the amplifier characteristics cannot be well taken care of.

SUMMARY OF THE INVENTION

The present invention has been made in view of the above-mentioned circumstances, and therefore has an object of the invention to provide a feed-forward amplifier which can implement a satisfactory linearity immediately after its activation.

It is another object of the invention to provide a feed-forward amplifier which has a high productivity.

It is further an object of the invention to provide a feed-forward amplifier which exhibits less long term fluctuations of its characteristics during the operation.

According to the present invention, there is provided a feed-forward amplifier comprising:

an error detection part including a signal divider for dividing an input signal into two divided input signals, a first level-and-phase adjusting circuit for adjusting a level and a phase of one divided input signal, a main amplifier for amplifying an output of the first level-and-phase adjusting circuit and a first combining circuit for combining an output of the main amplifier and the other divided input signal to extract a distortion component generated in the main amplifier, an error elimination part including a second level-and-phase adjusting circuit for adjusting a level and a phase of the distortion component to deliver an adjusted distortion component, an auxiliary amplifier for amplifying an output of the second level-and-phase adjusting circuit and a second combining circuit for combining an output of the auxiliary amplifier and the output of the main amplifier to deliver a resultant compensated output signal, a first control means for controlling the first level-and-phase adjusting circuit such that the distortion component becomes minimum and a second control means for controlling the second level-and-phase adjusting circuit such that a predetermined signal component such as a pilot signal contained in the resultant compensated output signal become minimum, wherein the first control means includes a first temperature sensor for sensing corresponding temperature of the main amplifier, the second controlling means includes a second temperature sensor for sensing corresponding temperature of the auxiliary amplifier, the first control means performs control of the first level-and-phase adjusting circuit with controlling values preset by a sensed corresponding temperature of the main amplifier at operation start (activation time) and the second control means performs control of the second level-and-phase adjusting circuit with controlling values preset by a sensed corresponding temperature of the auxiliary main amplifier at operation start.

In more detail, a feed-forward amplifier of the present invention comprises:

dividing means for dividing an input signal into two divided input signal components;

first delay means for delaying one of the divided input signal components;

first vector adjustment means for adjusting an attenuation amount and a phase shift amount of the other divided input signal components;

main amplifying means for amplifying an output of the first vector adjustment means;

first coupler for adding a pilot signal into an output of the main amplification means;

second coupler for branching the output signal of the main amplification means to which the pilot signal has been added;

third coupler for combining an output of the first delay means with an output of the second coupler;

second vector adjustment means for adjusting an attenuation amount and a phase shift amount of an output of the third coupler;

auxiliary amplifying means for amplifying an output of the second vector adjustment means;

second delay means for delaying the output of the main amplifying means to which the pilot signal has been added;

fourth coupler for combining the output of the auxiliary amplifying means with an output of the second delay means to deliver a resultant compensated signal;

fifth coupler for branching the output of the auxiliary amplification means;

first detection means for detecting a signal level of an output of the fifth coupler;

first temperature sensing means for detecting a temperature in the vicinity of the main amplifying means;

first control means for controlling the first vector adjustment means to set a first preset attenuation amount and a first preset phase shift amount at an activation time and, thereafter, to adjust said attenuation amount and phase shift amount so that the value detected by the first detection means is minimized, the preset attenuation amount and preset phase shift amount being predetermined in accordance with temperature detected by the first temperature sensing means;

sixth coupler for branching an output of the fourth coupler;

second detection means for detecting a signal level of the output of the sixth coupler;

second temperature sensing means for detecting a temperature in the vicinity of the auxiliary amplifying means; and second control means for control the second vector adjustment means to set a second preset attenuation amount and a preset phase shift amount at an activation time and, thereafter, to adjust the attenuation amount and phase shift amount so that the value detected by the second detection means is minimized, the second preset attenuation amount and second preset phase shift amount being predetermined in accordance with temperature detected by the second temperature sensing means.

Therefore, the present invention can provide a feed-forward amplifier which can achieve a satisfactory linearity immediately after its activation, which is highly productive, and which exhibits less long term fluctuations of its characteristics.

DETAILED DESCRIPTION OF THE PREFERRED EMBODIMENTS

With reference to the accompanying drawings, embodiments of the present invention will hereinafter be described in detail.

Figure 1:
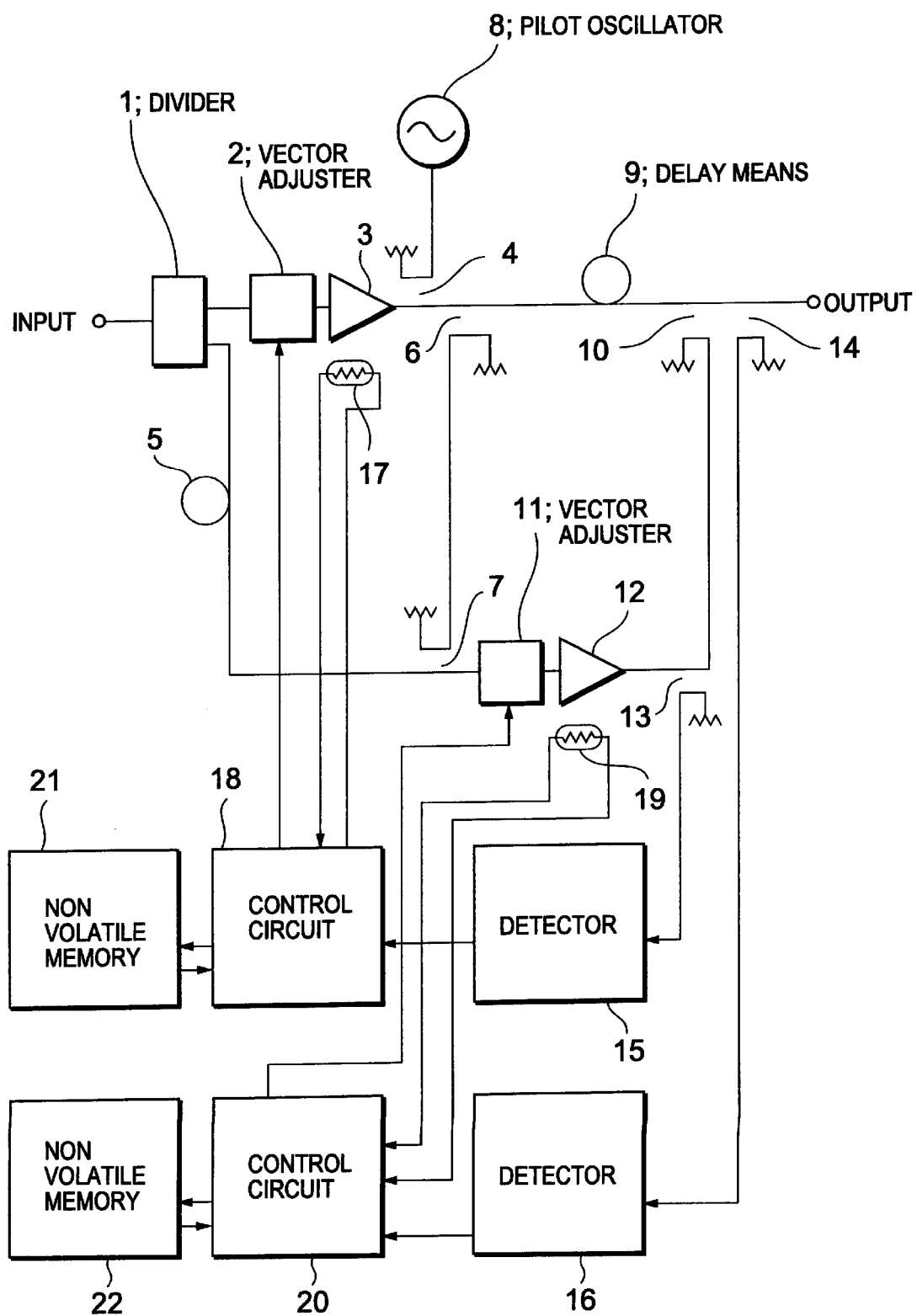
FIG. 1 is a block diagram showing a feed-forward amplifier of an embodiment according to the present invention.
Figure 2:
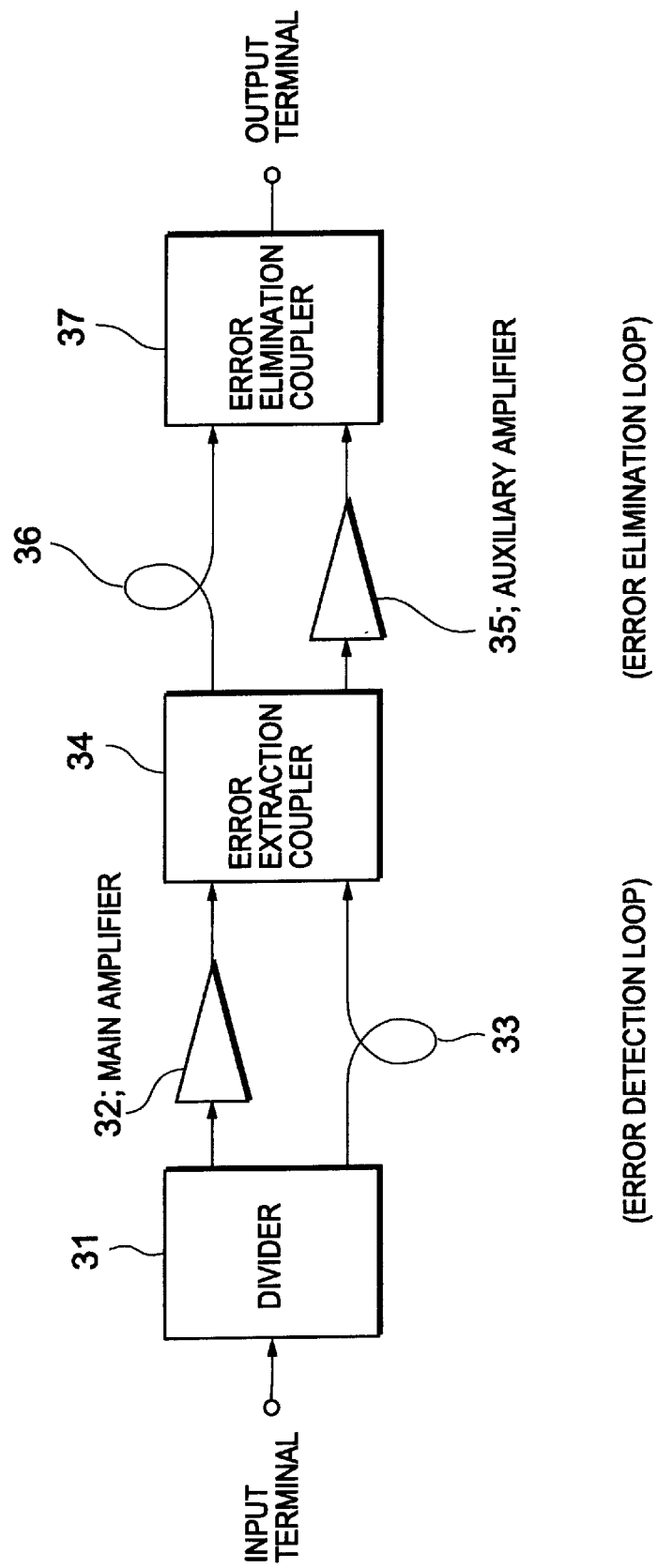
FIG. 2 is a block diagram showing the principle of a conventional feed-forward amplifier.
Figure 3:
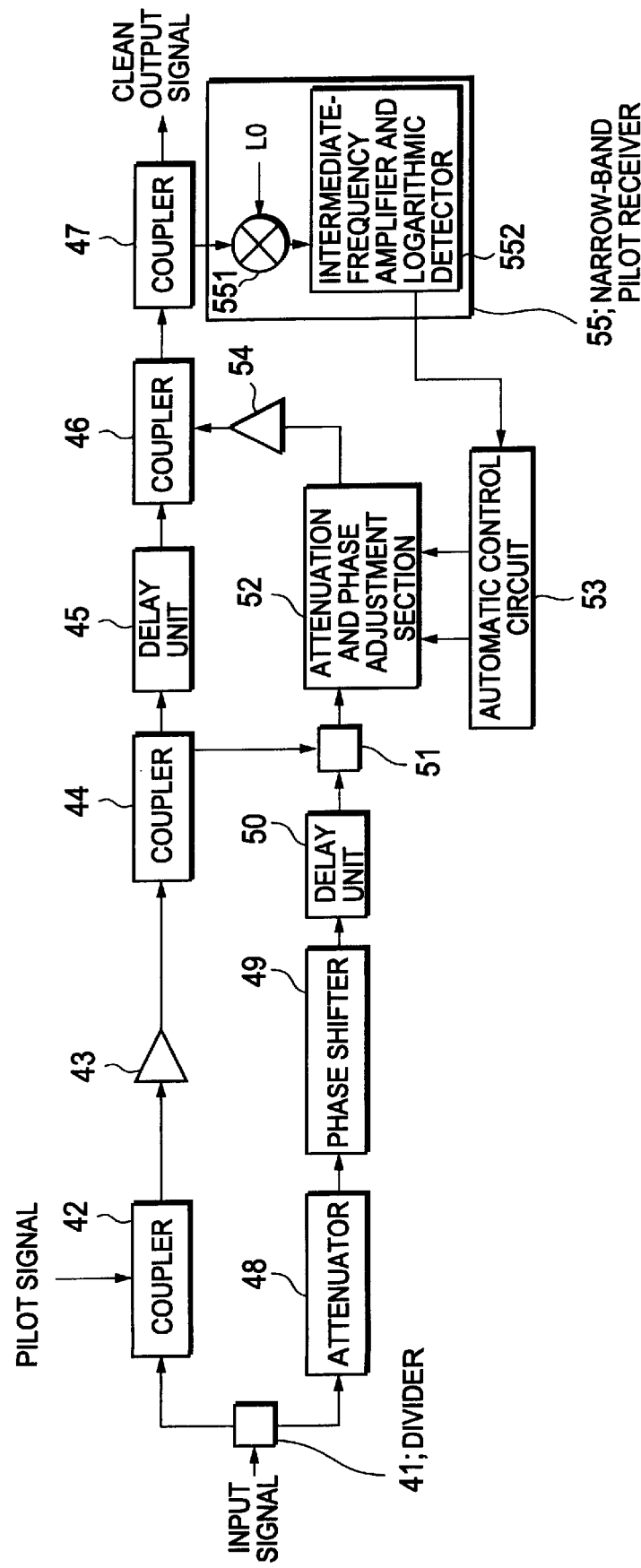
FIG. 3 is a block diagram showing a feed-forward amplifier of first prior art.
Figure 4:
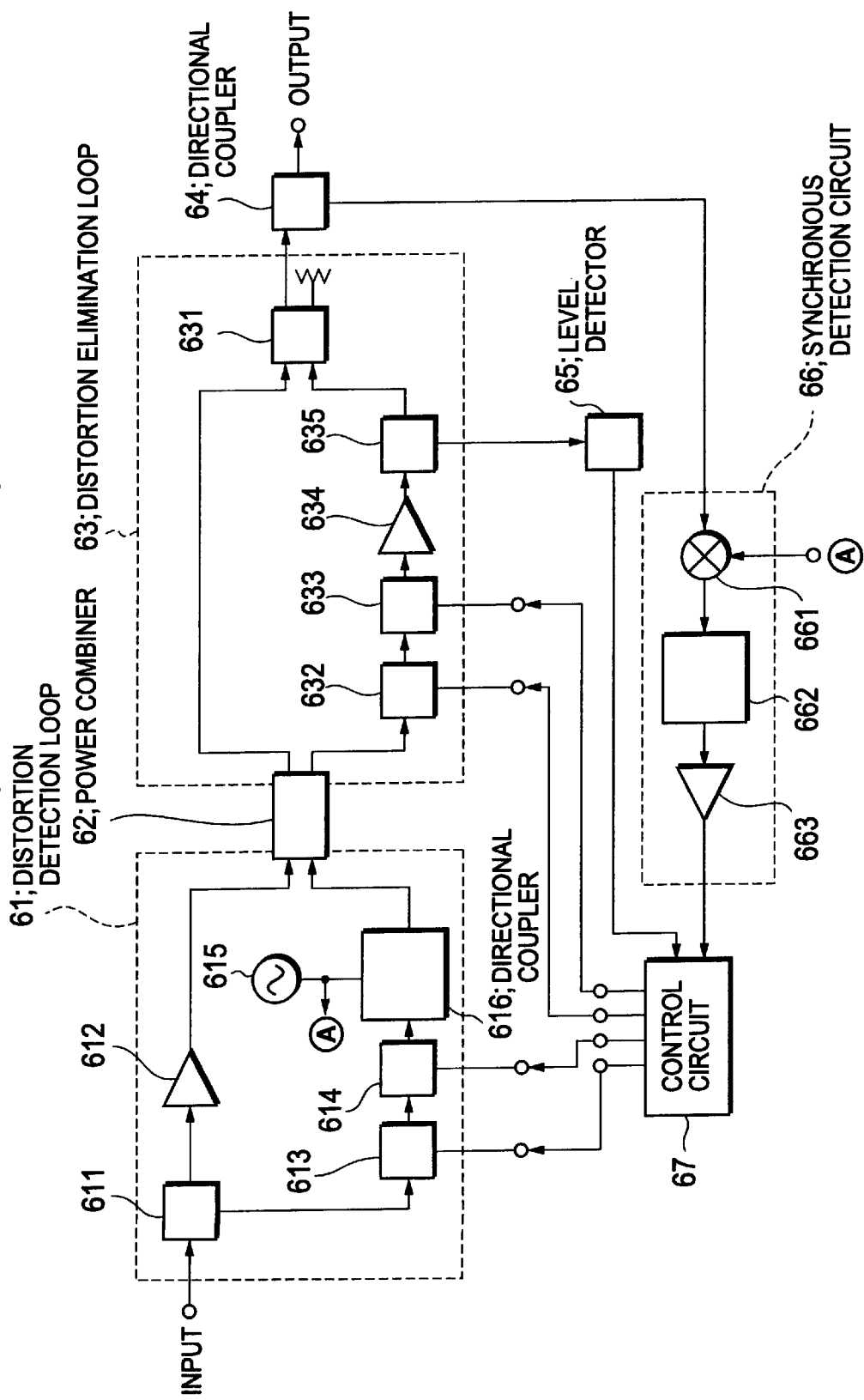
FIG. 4 is a block diagram showing a feed-forward amplifier of second prior art.
Figure 5:
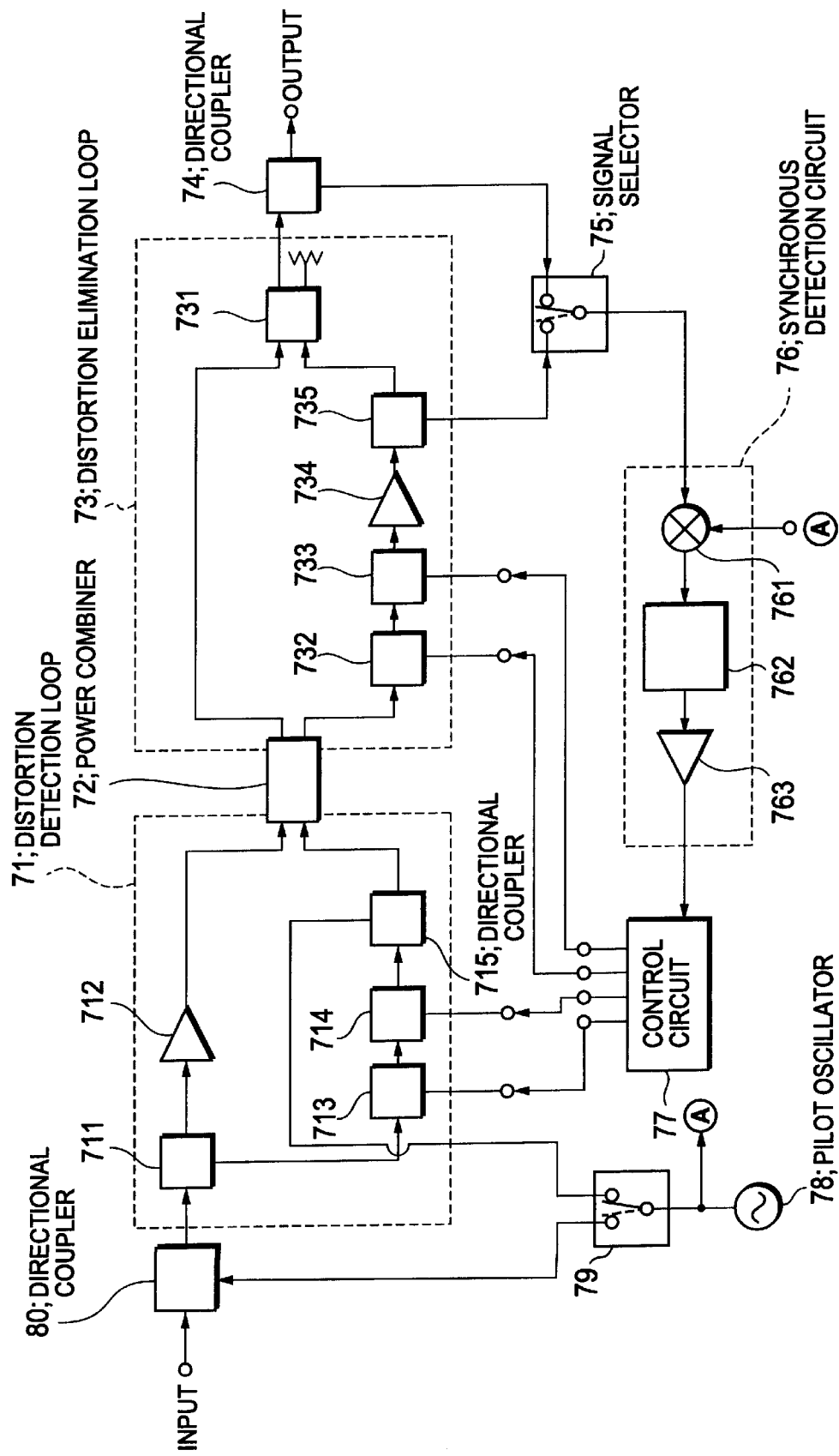
FIG. 5 is a block diagram showing a feed-forward amplifier of third prior art.
Figure 6:
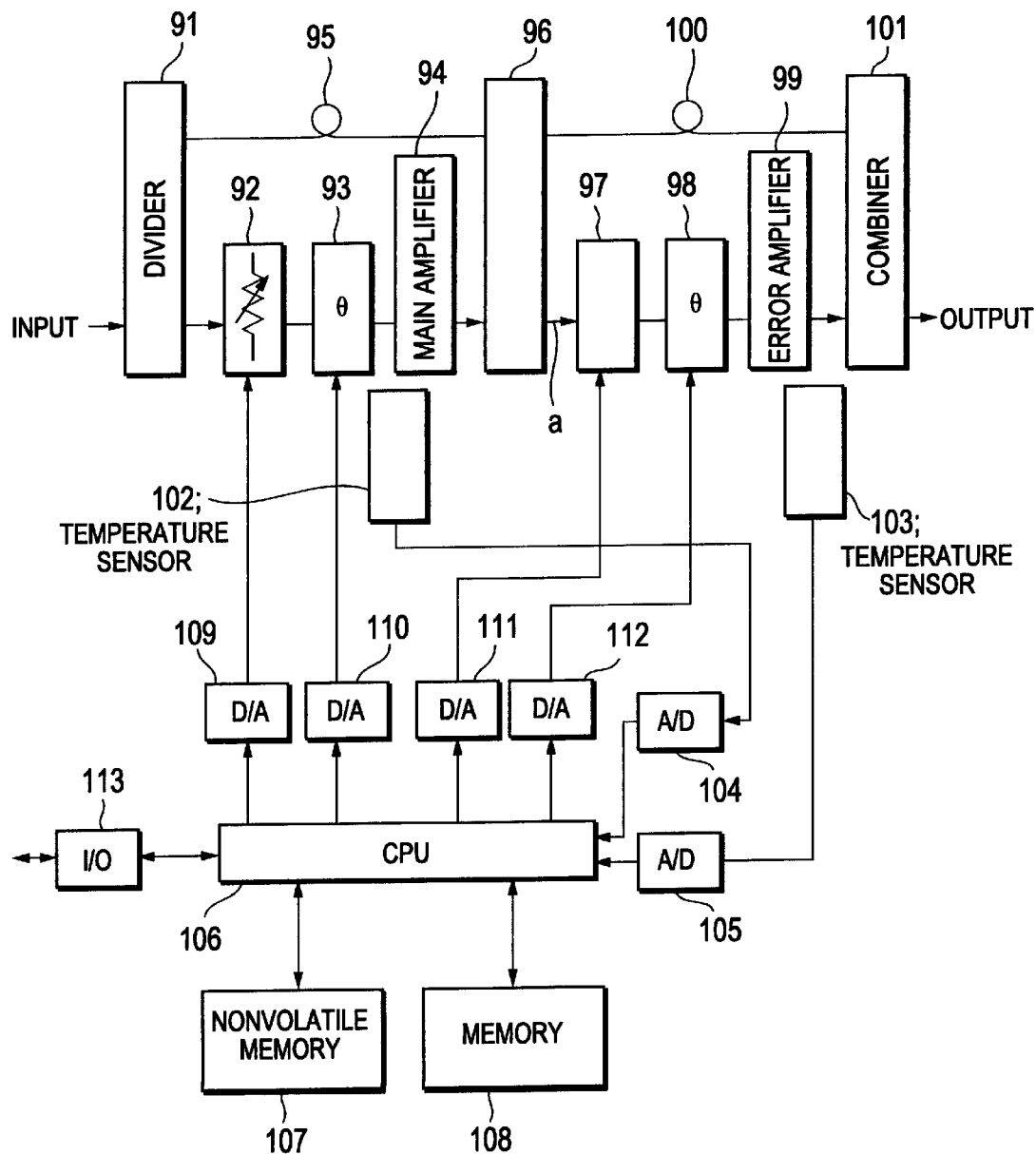
FIG. 6 is a block diagram showing a feed-forward amplifier of fourth prior art.

FIG. 1 shows an embodiment in block form of a feed-forward amplifier in accordance with the present invention.

As shown in FIG. 1, the feed-forward amplifier is roughly comprised of a divider 1, a vector adjuster 2, a main amplifier 3, a directional coupler 4, delay means 5, a directional coupler 6, a directional coupler 7, a pilot oscillator 8, delay means 9, a directional coupler 10, a vector adjuster 11, an auxiliary amplifier 12, a directional coupler 13, a directional coupler 14, a detector 15, a detector 16, a temperature sensor 17, a control circuit 18, a temperature sensor 19, a control circuit 20, a nonvolatile memory 21 and a nonvolatile memory 22.

The divider 1 divides an input signal into two signal components. The vector adjuster 2 adjusts the amplitude and phase of a signal component from one of the output paths of the divider 1 in response to a control signal. The main amplifier 3 amplifier the output signal of the vector adjuster 2. The directional coupler 4 couples a pilot signal to the output path of the main amplifier 3. The delay means 5, e.g., a delay line, delays a signal component from the other output path of the divider 1. The directional coupler 6 branches the signal from the output path of the directional coupler 4. The directional coupler 7 couples the signal extracted by the directional coupler 6 to the output path of the delay means 5.

The pilot oscillator 8 generates the pilot signal. The delay means 9, e.g., a delay line, delays the signal from the output path of the directional coupler 6. The directional coupler 10 couples an output signal of the auxiliary amplifier 12 to the output path of the delay means 9. The vector adjuster 11 adjusts the output signal of the directional coupler 7 in amplitude and phase. The auxiliary amplifier 12 amplifies the output signal of the vector adjuster 11. The directional coupler 13 branches the signal on the output path of the auxiliary amplifier. The directional coupler 14 branches the signal on the output path of the directional coupler 10. The detector 15 detects the strength of the output signal of the auxiliary amplifier 12 through the output of the directional coupler 13.

The detector 16, e.g., a synchronous detection circuit, detects the strength (level) of the pilot signal component in the output signal of the main amplifier 3 through the output of the directional coupler 14. The temperature sensor 17 measures the temperature in the vicinity of the main amplifier 3. The control circuit 18 determines the attenuation and phase shift amount of the vector adjuster 2 on the basis of both the value detected by the detection circuit 15 and the temperature measured by the temperature sensor 17. The temperature sensor 19 measures the temperature in the vicinity of the auxiliary amplifier 12.

The control circuit 20 determines the attenuation and phase shift amount of the vector adjuster 11 on the basis of the value detected by the detection circuit 16 and the temperature measured by the temperature sensor 19. The nonvolatile memory 21 stores control values of the control circuit 18 corresponding to temperatures measured by the temperature sensor 17. The nonvolatile memory 22 stores control values of the control circuit 20 corresponding to temperatures measured by the temperature sensor 19.

Next, the operation of the feed-forward amplifier of this embodiment will be described with reference to FIG. 1.

An input signal is divided into two signal components by the divider 1. The amplitude and phase of one of the two signal components are adjusted by the vector adjuster 2, and the resultant signal component is thereafter applied to the main amplifier 3 to be amplified. The output signal is applied from the main amplifier 3 via the delay means 9 and, at the same time, part of it is extracted by the directional coupler 6.

The other signal component divided by the divider 1 is appropriately delayed by the delay means 5, and the resultant signal component is combined through the directional coupler 7 with the signal extracted from the output signal of the main amplifier 3. The attenuation amount and phase shift amount of the vector adjuster 2 are adjusted so that the transfer function of a path from the input terminal to the directional coupler 7 via the main amplifier 3 and the transfer function of a path from the input terminal to the directional coupler 7 via the delay means 5 are equal in amplitude but anti (reversed)-phase relative to each other. Therefore, in the output of the directional coupler 7, the main signal components (i.e., the signal components equivalent in quality to the input signal having no distortions added thereto) cancel each other, and hence only an error component is output. The amplitude and phase of this error component are adjusted by the vector adjuster 11, and the resultant error component is thereafter amplified by the auxiliary amplifier 12. In the output path of the auxiliary amplifier 12 the strength of the output signal of the auxiliary amplifier 12 is detected by the directional coupler 13 and the detector 15. The control circuit 18 determines the attenuation and phase shift amount of the vector adjuster 2 on the basis of the value detected by the detector 15 and the temperature measured in the vicinity of the main amplifier 3 by the temperature sensor 17.

The pilot oscillator 8 applies the pilot signal to the output signal of the main amplifier 3 via the directional coupler 4, and the delay means 9 appropriately delays the resultant output signal. The delayed output signal is thereafter combined with the output signal of the auxiliary amplifier 12 through the directional coupler 10. The attenuation amount and phase shift amount of the vector adjuster 11 are adjusted so that the transfer function of a path from the main amplifier 3 to the output terminal via the delay means 9 and the transfer function of a path from the main amplifier 3 to the output terminal via the auxiliary amplifier 12 are equal in terms of amplitude but bear an anti-phase relationship to each other. Therefore, an error component (composed of signal distortion and noise) produced along the transfer path via the main amplifier 3 does not appear at the output terminal. Likewise, the pilot signal injected from the directional coupler 4 is present only on the transfer path via the main amplifier 3 in a manner similar to the error component. Thus, if a distortion compensation is properly made, the pilot signal does not leak at the output terminal. After the distortion compensation has been made by the directional coupler 10, the directional coupler 14 and the detector 16 detect the strength of the pilot signal component in the output signal. The control circuit 20 determines the attenuation and phase shift amount of the vector adjuster 11 on the basis of the value detected by the detector 16 and the temperature measured in the vicinity of the auxiliary amplifier 12 by the temperature sensor 19.

Next, a technique for setting the passage losses and phase shift amounts of the vector adjusters in the feed-forward amplifier of this embodiment will be described.

In the feed-forward amplifier of this embodiment, control values at the time of its activation are determined by temperatures. More specifically, the temperature in the vicinity of the main amplifier 3 is detected by the temperature sensor 17. The control value for the vector adjuster 2 corresponding to the detected temperature is determined by referring to the value stored in the nonvolatile memory 21. The temperature in the vicinity of the auxiliary amplifier 12 is detected by the temperature sensor 19. The control value for the vector adjuster 11 corresponding to the detected temperature is determined by referring to the value stored in the nonvolatile memory 22. Control values corresponding to temperatures are previously written to the nonvolatile memories 21 and 22.

The control values during normal operations are controlled by a similar technique to those disclosed by, e.g., the aforementioned second and third prior art device. The transfer function of the vector adjuster 2 is defined by the control circuit 18. Detector 15 detects the strength of part of the output signal of the auxiliary amplifier 12 extracted by the directional coupler 13 and the circuit 18 controls the detected strength of that signal from the auxiliary amplifier 12 so that it is minimized. The transfer function of the vector adjuster 11 is defined by the control circuit 20. Detector 16 detects the strength of the output signal component of the pilot oscillator 8 injected via the directional coupler 4 from the distortion-free output signal extracted by the directional coupler 14 and the circuit 20 controls the detected strength of the distortion-free pilot signal that it is minimized. The pilot signal injected via the directional coupler 4 is present only on the transfer path via the main amplifier 3 in a manner similar to the distortion component. Therefore, if a distortion compensation is properly made, the pilot signal does not leak at the output terminal. Thus, by utilizing this characteristic, the strength of the pilot signal is measured by the detector 16 via the directional coupler 14 from the output terminal, and the vector adjuster 11 is adjusted by the control circuit 20 so that the strength of the pilot signal is minimized. It should be noted that the level of the pilot signal injected through the directional coupler 4 must be smaller than that of the error component of the main amplifier 3 so as not to adversely affect the detector 15 in its detecting the error component.

Now, a technique for writing the temperature-versus-control-value data to the nonvolatile memories will be described. The simplest technique for setting the control values of the vector adjusters is to optimize the control values by artificially changing the transfer functions of the vector adjuster 2 and those of the vector adjuster 11. If temperature characteristics are to be considered as disclosed by the fourth prior art device, the control values may be optimized for each temperature by changing the temperatures around the amplifiers. However, this is not productive, and hence elevates the manufacturing cost. On the other hand, also available is a technique in which the optimal control value is found for a specific temperature by hypothesizing standard temperature characteristics and the control value corresponding to a temperature change may be calculated from that optimal control value. A simple technique to achieve this is to change the control value in function of a temperature change using a linear function. However, this technique addresses a shortcoming that the total characteristics are impaired due to a change in the error detection loop and error elimination loop characteristics when there are deviations in the temperature-versus-gain-change characteristics and temperature-versus-phase-change characteristics of the amplifiers used.

As described above, the feed-forward amplifier of the present invention provides means for implementing optimal transfer functions corresponding to the temperatures at the time of its activation and an automatic control mechanism for optimally controlling the distortion characteristics during the actual operations. As a result of this structure, a table of temperatures versus control values can be prepared extremely easily.

First of all, as a first technique, a regular signal is applied to the feed-forward amplifier to carry out automatic control in the aforementioned steady state. When the temperature characteristics become satisfactory under the automatic control, a control value is written to the nonvolatile memory 21 by referring to the value detected by the temperature sensor 17, and a control value is written to the nonvolatile memory 22 by referring to the value detected by the temperature sensor 19. As a result of this operation, a table of temperatures versus optimal control values can be obtained with ease.

Next, as a second technique, a regular signal is applied to the feed-forward amplifier to carry out automatic control in the aforementioned steady state while performing such a mild temperature cycle as to allow the automatic control to follow and the feed-forward amplifier to maintain the thermal equilibrium. While keeping the distortion characteristics satisfactory under the automatic control, a control value is written to the nonvolatile memory 21 by referring to the value detected by the temperature sensor 17, and a control value is written to the nonvolatile memory 22 by referring to the value detected by the temperature sensor 19. As a result of this operation, a table of temperatures versus optimal control values can be prepared with ease.

Further, as a third technique, a control value is written to the first nonvolatile memory 21 by referring to the value detected by the first temperature sensor 17, and a control value is written to the second nonvolatile memory 22 by referring to the value detected by the second temperature sensor 19 during the actual operations with distortion characteristics maintained satisfactory. As a result of this operation, a table of temperatures versus optimal control values can be updated with ease in accordance with long term fluctuations.

While the embodiment of the present invention has been described in detail on the basis of the drawings in the foregoing, specific structures of the present invention are not limited to this embodiment, and therefore, the present invention includes such design modifications and variations as not to depart from the scope of its novel concepts. For example, the input signal to the feed-forward amplifier of the present invention may be a single-frequency signal or a multi-frequency signal. Further, the nonvolatile memories 21 and 22 may be constructed of EEPROMs.

As described above, according to the present invention, the transfer functions immediately after the activation of the feed-forward amplifier are determined immediately after the activation by utilizing a previously prepared table of temperatures versus control values. Therefore, a feed-forward amplifier having satisfactory linearity characteristics immediately after its activation can be constructed.

Further, the table of temperatures versus control values of the feed-forward amplifier can be prepared automatically. Therefore, a highly productive feed-forward amplifier can be constructed.

Still further, the table of temperatures versus control values can be updated automatically during the operation of the feed-forward amplifier. Therefore, long term fluctuations of the amplifier characteristics can be corrected, and hence a feed-forward amplifier exhibiting less long term fluctuations of its characteristics can be implemented.

What is claimed is:

1. A feed-forward amplifier apparatus comprising:
    an error detection part including a signal divider for dividing an input signal into two divided input signals, a first level-and-phase adjusting circuit for adjusting a level and a phase of one divided input signal, a main amplifier for amplifying an output of said first level-and-phase adjusting circuit and a first combining circuit for combining an output of said main amplifier and the other divided input signal to extract a distortion component generated in said main amplifier,
    an error elimination part including a second level-and-phase adjusting circuit for adjusting a level and a phase of said distortion component, an auxiliary amplifier for amplifying an output of said second level-and-phase adjusting circuit and a second combining circuit for combining an output of said auxiliary amplifier and the output of said main amplifier to deliver a resultant compensated output signal, a first control means for controlling said first level-and-phase adjusting circuit such that said distortion component is minimized, and a second control means for controlling said second level-and-phase adjusting circuit such that a predetermined signal component contained in said resultant compensated output signal is minimized, wherein said first control means includes a first temperature sensor for sensing a corresponding temperature of said main amplifier, said second control means includes a second temperature sensor for sensing a corresponding temperature of said auxiliary amplifier, said first control means performs control of said first level-and-phase adjusting circuit with controlling values preset by a sensed corresponding temperature of said main amplifier at a start-up of said feed-forward amplifier apparatus and said second control means performs control of said second level-and-phase adjusting circuit with controlling values present by a sensed corresponding temperature of auxiliary main amplifier at a start-up of said feed-forward amplifier apparatus.

2. A feed-forward amplifier, comprising:

dividing means for dividing an input signal into two divided input signal components;

first delay means for delaying one of said divided input signal components;

first vector adjustment means for adjusting an attenuation amount and a phase shift amount of the other one of said divided input signal components;

main amplifying means for amplifying an output of said first vector adjustment means;

first coupler for adding a pilot signal into an output of said main amplification means;

second coupler for branching the output signal of said main amplification means to which the pilot signal has been added;

third coupler for combining an output of said first delay means with an output of said second coupler;

second vector adjustment means for adjusting an attenuation amount and a phase shift amount of an output of said third coupler;

auxiliary amplifying means for amplifying an output of said second vector adjustment means;

second delay means for delaying the output of said main amplifying means to which the pilot signal has been added;

fourth coupler for combining the output of said auxiliary amplifying means with an output of said second delay means to deliver a resultant compensated signal;

fifth coupler for branching the output of said auxiliary amplification means;

first detection means for detecting a signal level of an output of said fifth coupler;

first temperature sensing means for detecting a temperature in the vicinity of said main amplifying means;

first control means for controlling said first vector adjustment means to set a first preset attenuation amount and a first preset phase shift amount at an activation time and, thereafter, to adjust said attenuation amount and phase shift amount so that the value detected by said first detection means is minimized, said preset attenuation amount and preset phase shift amount being predetermined in accordance with temperature detected by said first temperature sensing means;

sixth coupler for branching an output of said fourth coupler;

second detection means for detecting a signal level of the output of said sixth coupler;

second temperature sensing means for detecting a temperature in the vicinity of said auxiliary amplifying means; and second controlling means for control said second vector adjustment means to set a second preset attenuation amount and a preset phase shift amount at an activation time and, thereafter, to adjust said attenuation amount and phase shift amount so that the value detected by said second detection means is minimized, said second preset attenuation amount and second preset phase shift amount being predetermined in accordance with temperature detected by said second temperature sensing means.

3. A feed-forward amplifier as claimed in claim 2, further comprising:

a first storing means for storing the control values at the time of activation for said first vector adjustment means, which corresponds to the temperature detected by said first temperature sensing means; and a second storing means for storing the control values at the time of activation for said second vector adjustment, which corresponds to the temperature detected by said second temperature sensing means.

4. A controlling method for a feed-forward amplifier as claimed in claim 3, comprising:

inputting a regular signal as the input signal; and writing, when satisfactory characteristics are obtained by said first control means and said second control means effecting automatic control under a steady state, the control values for said first vector adjustment means to said first storing means by referring to the temperature detected by said first temperature sensing means, and writing the control values for said second vector adjustment means to said second storing means by referring to the temperature detected by said second temperature sensing means.

5. A controlling method for a feed-forward amplifier as claimed in claim 3, comprising:

inputting a regular signal as the input signal; and writing, when satisfactory characteristics are obtained by said first control means and said second control means effecting automatic control under a steady state while performing such a mild temperature cycle as to allow said first and second control means to follow and said feed-forward amplifier to maintain a thermal equilibrium, the control values for said first vector adjustment means to said first storing means by referring to the temperature detected by said first temperature sensing means, and writing the control values for said second vector adjustment means to said information storing means by referring to the temperature detected by said second temperature sensing means.

6. A controlling method for a feed-forward amplifier as claimed in claim 3, comprising:

writing, while satisfactory distortion characteristics are maintained by said first control means and said second control means effecting automatic control under a steady state during an operation of said feed-forward amplifier, the control values for said first vector adjustment means to said information storing means by referring to the temperature detected by said first temperature sensing means, and writing the control values for said second vector adjustment means to said second storing means by referring to the temperature detected by said second temperature sensing means.

7. A feed-forward amplifier apparatus as claimed in claim 1, wherein said first control means has a memory storing a plurality of controlling values for said first level-and-phase adjusting circuit, said plurality of controlling values being preset according to a plurality of temperatures.

8. A feed-forward amplifier apparatus as claimed in claim 1, wherein said second control means has a memory storing a plurality of controlling values for said second level-and-phase adjusting circuit, said plurality of controlling values being preset according to a plurality of temperatures.

9. A feed-forward amplifier apparatus as claimed in claim 1, wherein said predetermined signal component is a pilot signal added into the output of said main amplifier.

* * * * *